(12) United States Patent
Matsubayashi et al.

(10) Patent No.: US 11,215,639 B2
(45) Date of Patent: Jan. 4, 2022

(54) PROBE CARD, SEMICONDUCTOR MEASURING DEVICE, AND SEMICONDUCTOR MEASURING SYSTEM

(71) Applicant: Mitsubishi Electric Corporation, Tokyo (JP)

(72) Inventors: Hiroto Matsubayashi, Tokyo (JP); Takayuki Matsumoto, Fukuoka (JP); Tomoaki Nakamura, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/757,761

(22) PCT Filed: Nov. 16, 2017

(86) PCT No.: PCT/JP2017/041278
§ 371 (c)(1),
(2) Date: Apr. 20, 2020

(87) PCT Pub. No.: WO2019/097629
PCT Pub. Date: May 23, 2019

(65) Prior Publication Data
US 2021/0140998 A1 May 13, 2021

(51) Int. Cl.
*G01R 1/067* (2006.01)
*G01R 1/073* (2006.01)
*G01R 31/26* (2020.01)

(52) U.S. Cl.
CPC ..... *G01R 1/06794* (2013.01); *G01R 1/07307* (2013.01); *G01R 31/2601* (2013.01)

(58) Field of Classification Search
CPC ............ G01R 1/06794; G01R 1/07307; G01R 31/2601
See application file for complete search history.

(56) References Cited

U.S. PATENT DOCUMENTS

| 2009/0003008 A1 | 1/2009 | Ohtake et al. |
| 2018/0072186 A1 | 3/2018 | Nakazaki et al. |

FOREIGN PATENT DOCUMENTS

| EP | 1 580 080 A1 | | 9/2005 |
| JP | 62048036 A | * | 3/1987 |
| JP | H01-182756 A | | 7/1989 |
| JP | H01-277780 A | | 11/1989 |
| JP | 04215450 A | * | 8/1992 |
| JP | 2005-306353 A | | 11/2005 |
| JP | 2006-064572 A | | 3/2006 |
| WO | 2016/159123 A1 | | 10/2016 |

OTHER PUBLICATIONS

International Search Report issued in PCT/JP2017/041278; dated Feb. 6, 2018.

* cited by examiner

*Primary Examiner* — Paresh Patel
(74) *Attorney, Agent, or Firm* — Studebaker & Brackett PC

(57) ABSTRACT

A probe card has an edge sensor. The edge sensor has a first needle and a second needle. The first needle and the second needle are in contact with each other when the first needle and a wafer are not in contact with each other, and the first needle and the second needle are not in contact with each other when the first needle and the wafer are in contact with each other. The probe card has a resistor connected between the first needle and the second needle.

9 Claims, 5 Drawing Sheets

PROBE CARD, SEMICONDUCTOR MEASURING DEVICE, AND SEMICONDUCTOR MEASURING SYSTEM

TECHNICAL FIELD

The present invention relates to a probe card used for measuring a semiconductor device manufactured on a wafer, a semiconductor measuring device for measuring a semiconductor device using the probe card, and a semiconductor measuring system including the probe card and the semiconductor measuring device.

BACKGROUND ART

A probe card including an edge sensor is used for measuring a semiconductor device in a wafer form. The edge sensor is used for detecting whether or not a measurement probe needle formed on the probe card has come into contact with the wafer.

The edge sensor includes a first needle and a second needle, and detects whether or not the first needle has come into contact with the wafer. In a state in which the first needle is not in contact with the wafer, the first needle and the second needle are in contact with each other. This is referred to as short-circuit state. The contact parts are a lower part of the first needle and an upper part of the second needle. On the other hand, in a state in which the first needle is in contact with the wafer, the first needle is lifted, so that the first needle and the second needle are not in contact with each other. This state is referred to as open-circuit state. Whether or not the first needle has come into contact with the wafer is found by determining whether the edge sensor is in a short-circuit state or an open-circuit state.

A semiconductor measuring device to which the probe card is connected determines whether or not the first needle has come into contact with the wafer, on the basis of whether the edge sensor is in a short-circuit state or an open-circuit state. This determination is performed as follows. First, the semiconductor measuring device measures the value of resistance (resistance of edge sensor) between the first needle and the second needle. Then, the magnitude relationship between the resistance value of the edge sensor and a threshold value set in the semiconductor measuring device is checked. If the resistance value of the edge sensor is smaller than the threshold value, it is determined that the edge sensor is in a short-circuit state. On the other hand, if the resistance value of the edge sensor is greater than the threshold value, it is determined that the edge sensor is in an open-circuit state. The semiconductor measuring device determines the state of the edge sensor through the above procedure, and determines that the first needle and the wafer are not in contact with each other if the edge sensor is in a short-circuit state. On the other hand, if the edge sensor is in an open-circuit state, the semiconductor measuring device determines that the first needle and the wafer are in contact with each other.

One example of a document describing a probe card including an edge sensor is Patent Document 1.

CITATION LIST

Patent Document

Patent Document 1: Japanese Laid-Open Patent Publication No. 1-182756

SUMMARY OF THE INVENTION

Problems to be Solved by the Invention

The resistance value of the edge sensor in the short-circuit state becomes greater as measurements of semiconductor devices are repeated or as time elapses. There are two factors therefor. The first factor is wear and deterioration of contact parts of the first needle and the second needle. The second factor is deterioration of elastic forces of the first needle and the second needle.

If the resistance value of the edge sensor in a short-circuit state becomes great, the semiconductor measuring device cannot determine whether or not the first needle has come into contact with the wafer. This is because, if the resistance value of the edge sensor is greater than the threshold value, the semiconductor measuring device erroneously determines that the edge sensor is in an open-circuit state even though the edge sensor should originally be determined to be in a short-circuit state.

As a result, the probe card or the edge sensor needs to be replaced, in order to continue measurement of a semiconductor device. Thus, cost increase and work time increase are inevitable.

The present invention has been made to solve the above problem, and an object of the present invention is to provide a probe card that enables the life of the probe card to be prolonged at low cost by performing simple working.

Solution to the Problems

A probe card according to the present invention includes an edge sensor having a first needle and a second needle, wherein the first needle and the second needle are in contact with each other when the first needle and a wafer are not in contact with each other, and the first needle and the second needle are not in contact with each other when the first needle and the wafer are in contact with each other. The probe card further includes a variable resistor connected between the first needle and the second needle.

A semiconductor measuring device according to the present invention is connectable to a probe card described below and is capable of setting a resistance value of a variable resistor described below. The probe card includes an edge sensor having a first needle and a second needle, wherein the first needle and the second needle are in contact with each other when the first needle and a wafer are not in contact with each other, and the first needle and the second needle are not in contact with each other when the first needle and the wafer are in contact with each other. The probe card further includes a variable resistor connected between the first needle and the second needle.

A semiconductor measuring system according to the present invention includes a probe card and a semiconductor measuring device described below. The probe card includes an edge sensor having a first needle and a second needle, wherein the first needle and the second needle are in contact with each other when the first needle and a wafer are not in contact with each other, and the first needle and the second needle are not in contact with each other when the first needle and the wafer are in contact with each other. The probe card further includes a variable resistor connected between the first needle and the second needle. The semiconductor measuring device is connected to the probe card, and determines that the first needle and the wafer are not in contact with each other if R<Rth is satisfied, and determines that the first needle and the wafer are in contact with each other if R>=Rth is satisfied, where R is a resistance value of the edge sensor and Rth is a threshold value.

Effect of the Invention

Using the probe card according to the present invention enables the life of the probe card to be prolonged by performing simple working.

Using the semiconductor measuring device according to the present invention enables the life of the probe card to be prolonged by setting the resistance value of the variable resistor mounted to the probe card.

Using the semiconductor measuring system according to the present invention enables the life of the probe card to be prolonged by performing simple working.

DESCRIPTION OF EMBODIMENTS

Embodiment 1

Embodiment 1 will be described with reference to the drawings.

Figure 1:
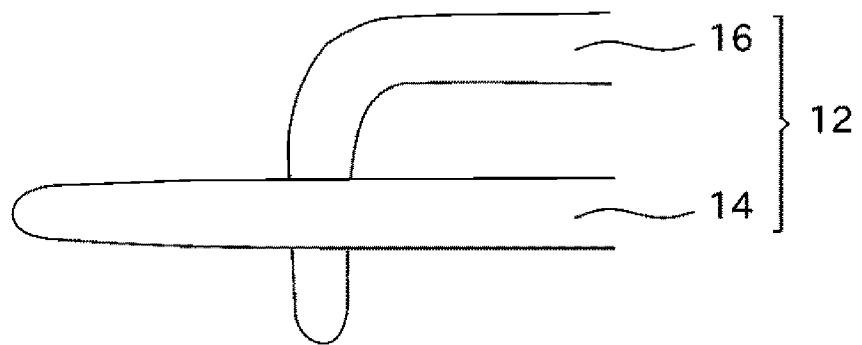
FIG. 1 is a top view of an edge sensor in embodiment 1.

FIG. 1 is a top view of an edge sensor 12. The edge sensor 12 has a first needle 14 and a second needle 16.

Figure 2:
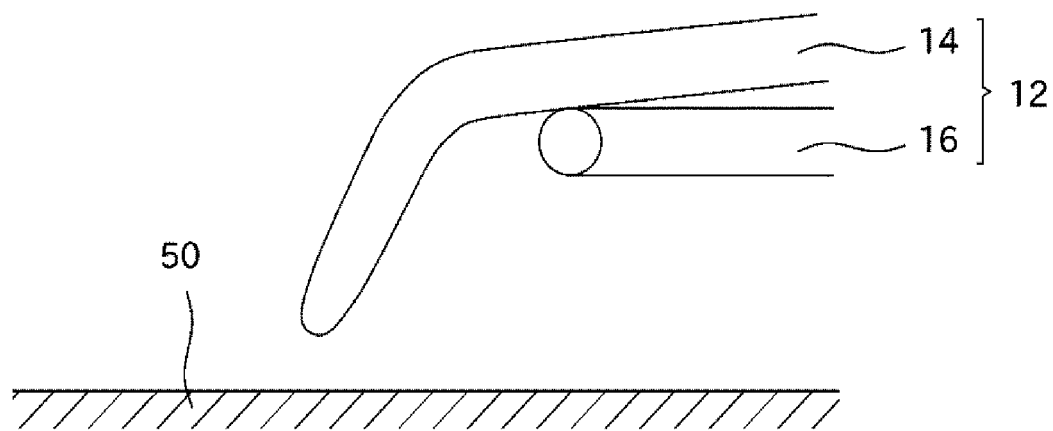
FIG. 2 is a side view of the edge sensor in a short-circuit state in embodiment 1.
Figure 3:
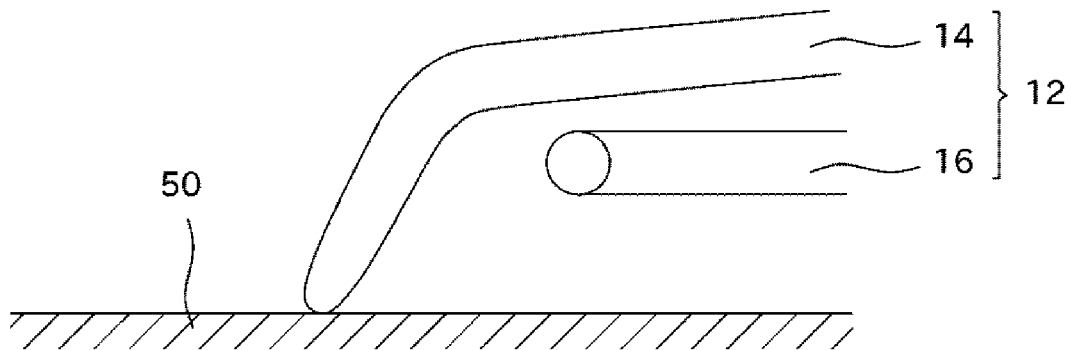
FIG. 3 is a side view of the edge sensor in an open-circuit state in embodiment 1.

FIG. 2 and FIG. 3 are side views of the edge sensor 12. FIG. 2 shows the case where the first needle 14 and a wafer 50 are not in contact with each other. In this state, the first needle 14 and the second needle 16 are in contact with each other. This is referred to as short-circuit state. At this time, the value of parasitic resistance occurring at the contact part between the first needle 14 and the second needle 16 is denoted by R2. FIG. 3 shows the case where the first needle 14 and the wafer 50 are in contact with each other. In this state, the first needle 14 is lifted, so that the first needle 14 and the second needle 16 are not in contact with each other. This is referred to as open-circuit state.

Figure 4:
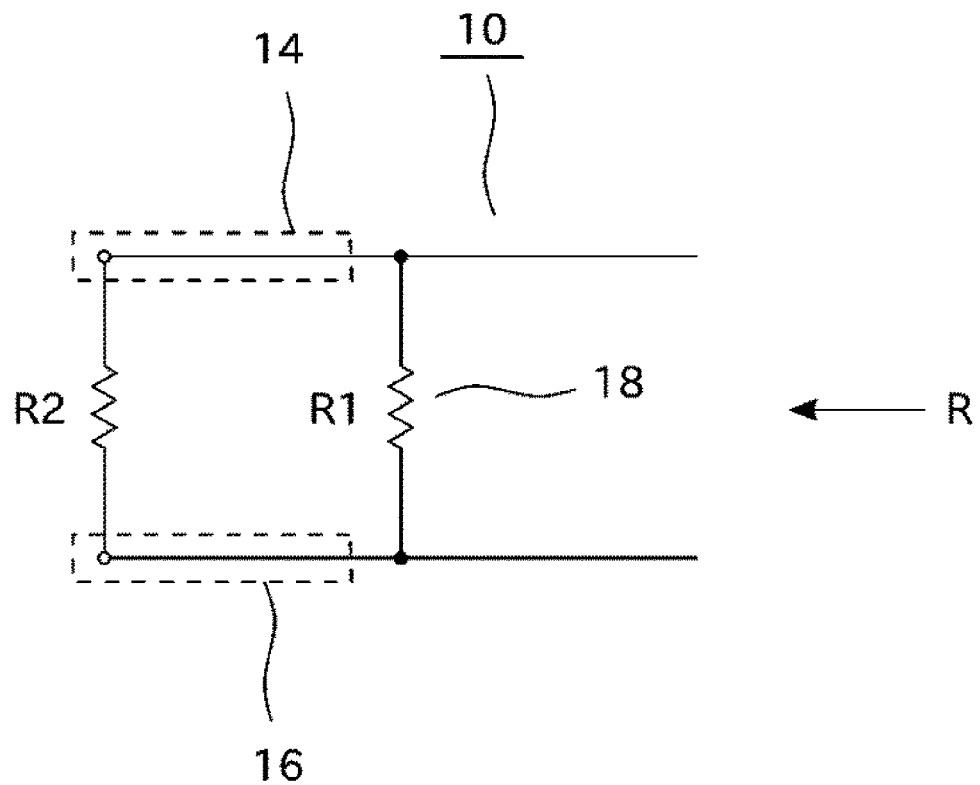
FIG. 4 is an equivalent circuit diagram of the probe card in a short-circuit state in embodiment 1.
Figure 5:
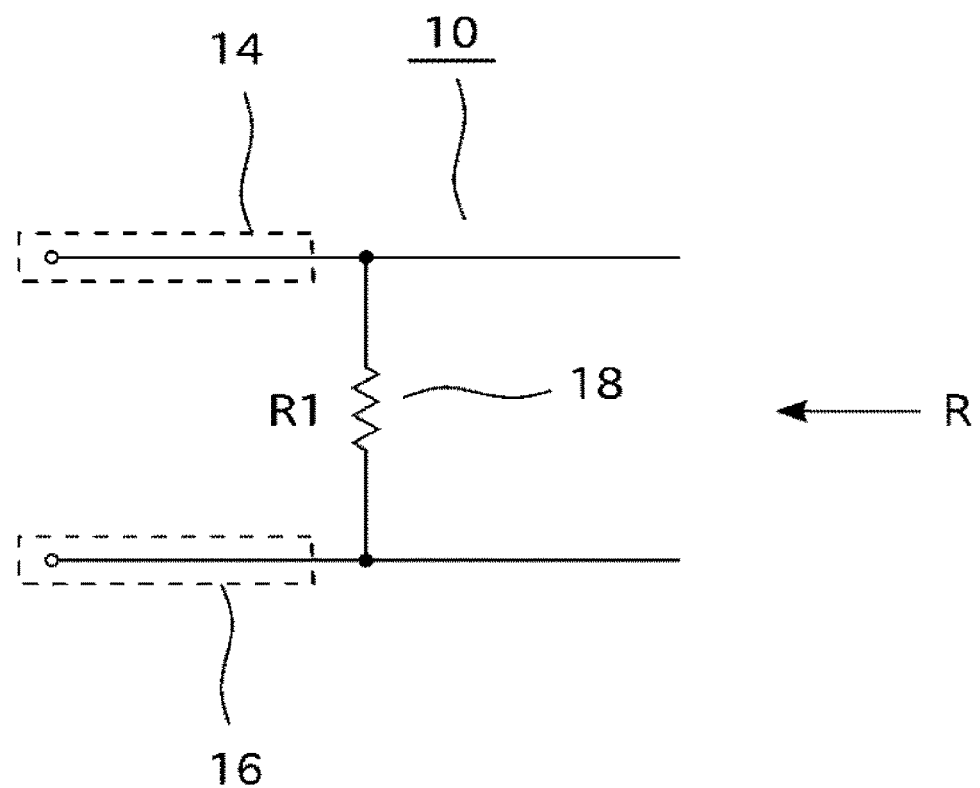
FIG. 5 is an equivalent circuit diagram of a probe card in an open-circuit state in embodiment 1.

FIG. 4 and FIG. 5 are equivalent circuit diagrams of a probe card 10 including the edge sensor 12. Here, probe needles and the like other than the edge sensor 12 are not shown. The probe card 10 has a resistor 18 between the first needle 14 and the second needle 16. The value of the resistor 18 is denoted by R1. Here, resistance when the edge sensor 12 is seen from the right side in the drawing is referred to as resistance of the edge sensor. The value of this resistance is denoted by R.

In FIG. 4, the edge sensor 12 is in a short-circuit state. In the drawing, R2 denotes the value of parasitic resistance occurring at the contact part between the first needle 14 and the second needle 16 as described above. At this time, R=R1*R2/(R1+R2) is satisfied. In FIG. 5, the edge sensor 12 is in an open-circuit state. At this time, R=R1 is satisfied.

Figure 6:
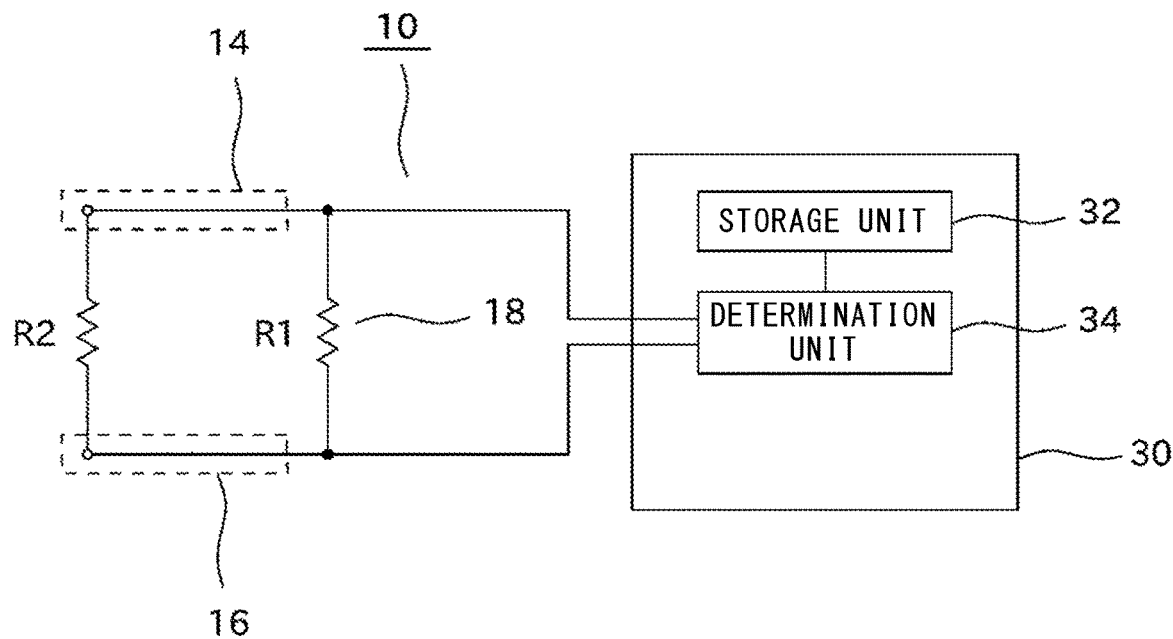
FIG. 6 is a diagram showing connection between a semiconductor measuring device and the probe card in a short-circuit state in embodiment 1.
Figure 7:
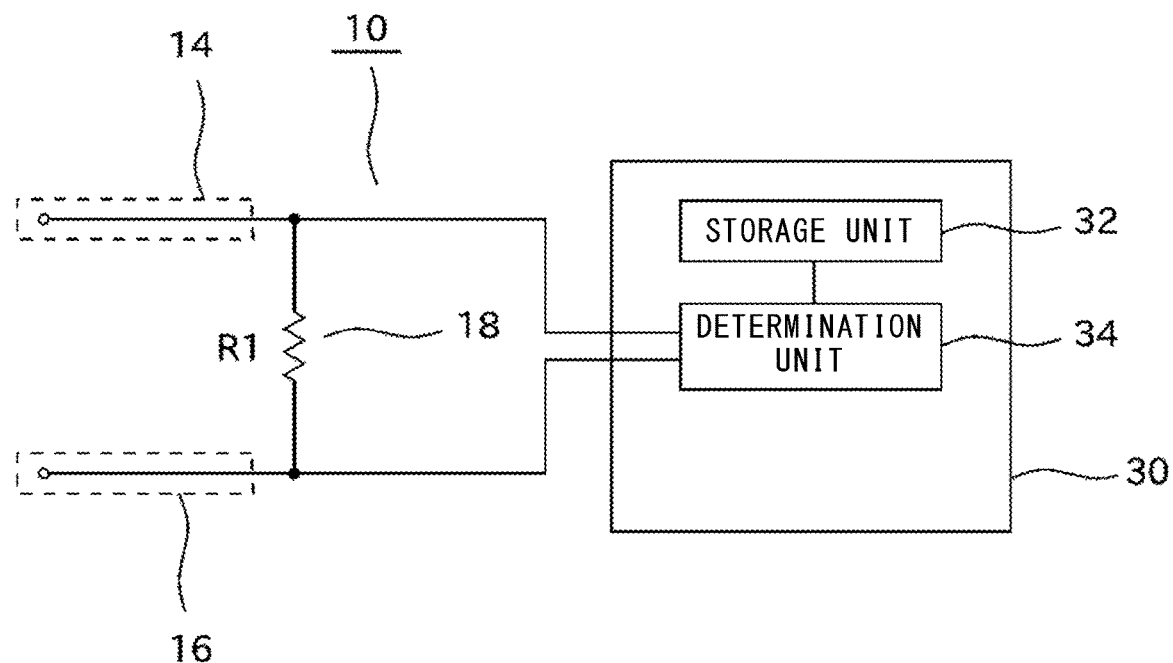
FIG. 7 is a diagram showing connection between the semiconductor measuring device and the probe card in an open-circuit state in embodiment 1.

FIG. 6 and FIG. 7 are diagrams in which the probe card 10 and a semiconductor measuring device 30 are connected to each other. The semiconductor measuring device 30 includes a storage unit 32 that stores a threshold value (Rth). Further, the semiconductor measuring device 30 includes a determination unit 34 which compares the value (R) of resistance of the edge sensor 12 with the threshold value (Rth) and, on the basis of the magnitude relationship therebetween, determines whether the first needle 14 and wafer 50 are in contact with each other or not in contact with each other.

In FIG. 6, the edge sensor 12 is in a short-circuit state. At this time, R=R1*R2/(R1+R2) is satisfied. In FIG. 7, the edge sensor 12 is in an open-circuit state. At this time, R=R1 is satisfied.

If R<Rth is satisfied, the determination unit 34 determines that the first needle 14 is not in contact with the wafer 50. On the other hand, if R>=Rth is satisfied, the determination unit 34 determines that the first needle 14 is in contact with the wafer 50.

The resistance value (R1) of the resistor 18 is set such that, if R2<=Rth is satisfied, a condition (condition 1) of R1>=Rth is satisfied, and if R2>Rth is satisfied, a condition (condition 2) of Rth<=R1<Rth*R2/(R2−Rth) is satisfied.

The value (R2) of parasitic resistance of the edge sensor 12 in a short-circuit state becomes greater as measurements of semiconductor devices are repeated or as time elapses. The factors therefor are wear and deterioration of contact parts of the first needle and the second needle, and reduction of elastic forces of these needles. If the resistor 18 is not provided, when R2 has increased to reach R2>=Rth, the semiconductor measuring device will erroneously determine that the edge sensor is in an open-circuit state even in the case where the edge sensor is in a short-circuit state. As a result, the edge sensor can no longer be used, and the probe card and the edge sensor need to be replaced.

However, in embodiment 1, since the resistor 18 is provided, the resistance value (R) of the edge sensor 12 in a short-circuit state can be made smaller than R2. Therefore, even if R2 is increased over time, it is possible to continuously use the probe card 10.

Further, by selecting R1 such that the condition 1 is satisfied in the case of R2<=Rth or the condition 2 is satisfied in the case of R2>Rth, determination in the determination unit 34 can be ensured. The reason is as follows.

First, the case of R2<=Rth (condition 1) will be described. In a short-circuit state, since R corresponds to parallel connection of R1 and R2, R<R2 is satisfied, so that R<Rth is satisfied. Therefore, the determination unit 34 can correctly determine the short-circuit state. On the other hand, in an open-circuit state, since R=R1 is satisfied, R>=Rth is satisfied from the condition 1. Therefore, the determination unit 34 can correctly determine the open-circuit state.

Next, the case of R2>Rth (condition 2) will be described. First, the short-circuit state is considered. By deforming R1<Rth*R2/(R2−Rth) in the condition 2, Rth>R1*R2/(R1+R2)) is obtained. The right-hand side of this expression corresponds to R in a short-circuit state, and thus R<Rth is satisfied. Therefore, the determination unit 34 can correctly determine the short-circuit state. Next, an open-circuit state is considered. In an open-circuit state, since R=R1 is satisfied, R>=Rth is satisfied also in the case of condition 2. Therefore, the determination unit 34 can correctly determine the open-circuit state.

Further, also in the case of using the probe card for a plurality of semiconductor measuring devices, the number of the probe cards needed is only one. In general, the threshold value (Rth) differs among the types of semiconductor measuring devices. However, no matter what value the threshold value (Rth) is, if R1 is selected so as to satisfy the condition 1 or 2, it suffices that one probe card is prepared.

Embodiment 2

Embodiment 2 will be described with reference to the drawings.

Figure 8:
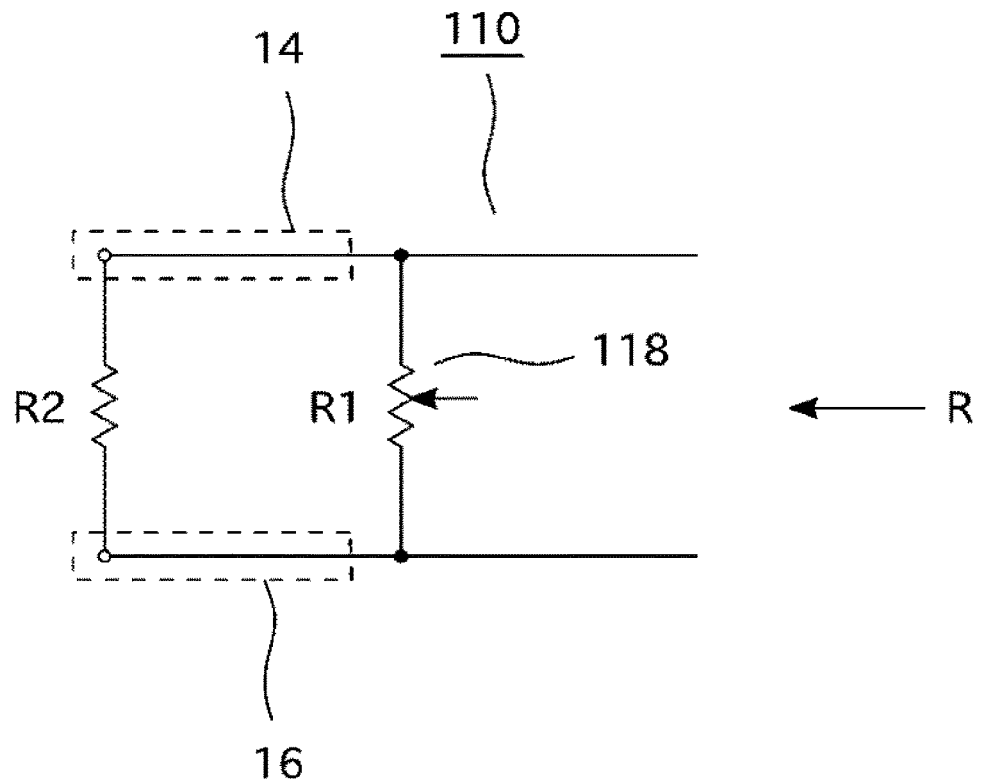
FIG. 8 is an equivalent circuit diagram of a probe card in a short-circuit state in embodiment 2.
Figure 9:
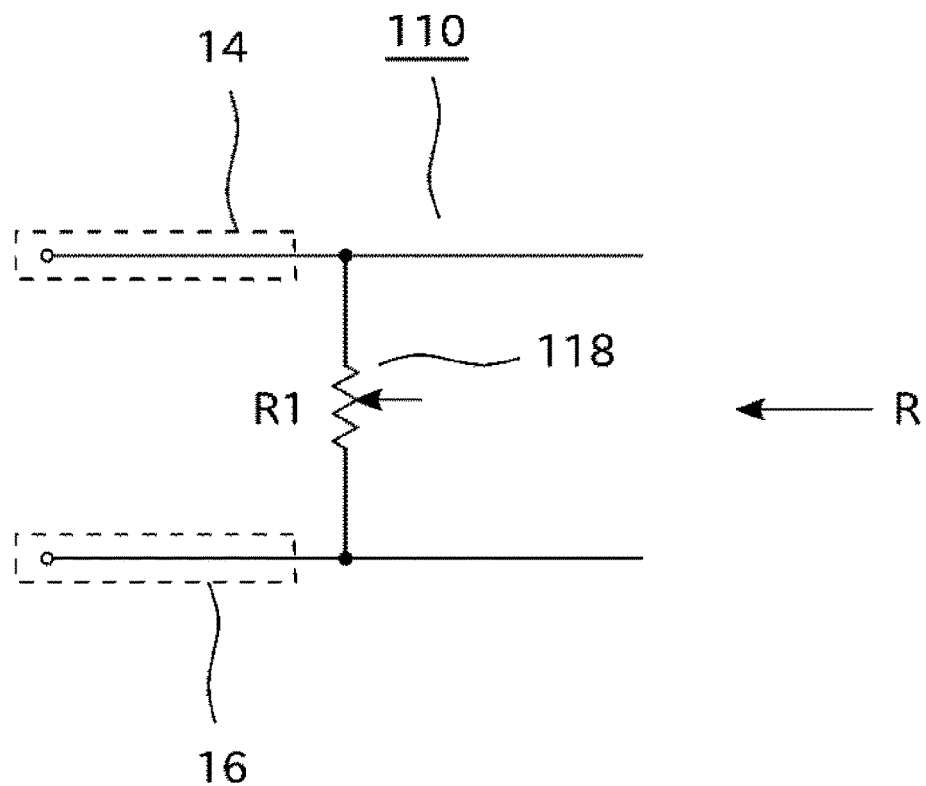
FIG. 9 is an equivalent circuit diagram of the probe card in an open-circuit state in embodiment 2.

FIG. 8 and FIG. 9 are equivalent circuit diagrams of a probe card 110 including the edge sensor 12 in a short-circuit state and an open-circuit state, respectively. The probe card 110 in embodiment 2 is the same as that in embodiment 1, but a variable resistor 118 is provided instead of the resistor 18 in embodiment 1.

Figure 10:
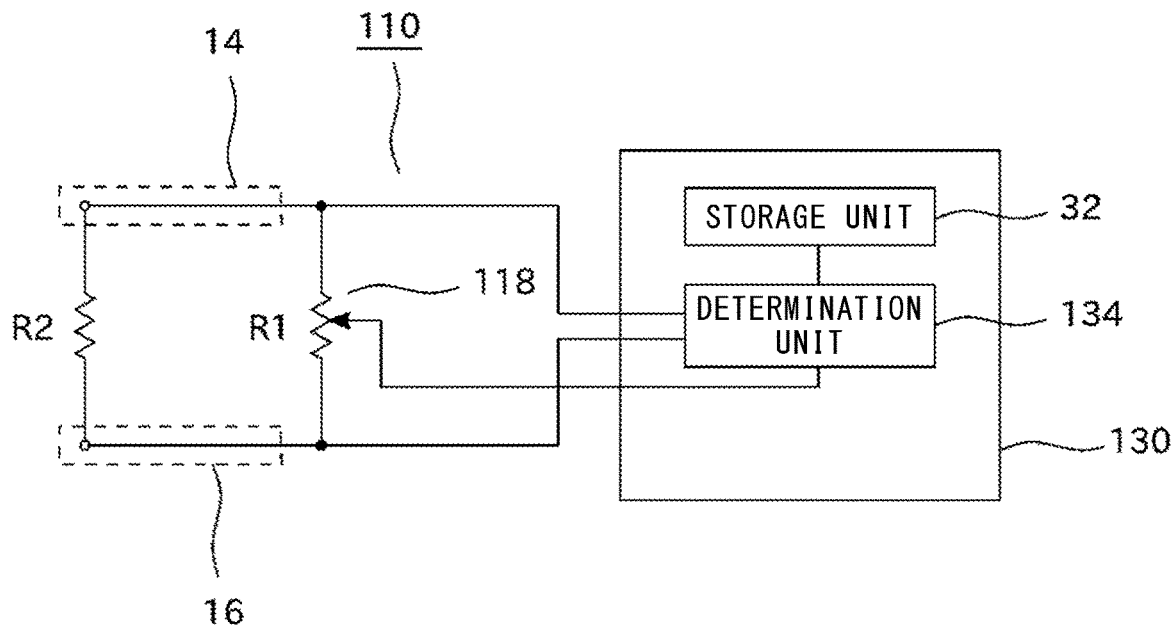
FIG. 10 is a diagram showing connection between a semiconductor measuring device and the probe card in a short-circuit state in embodiment 2.
Figure 11:
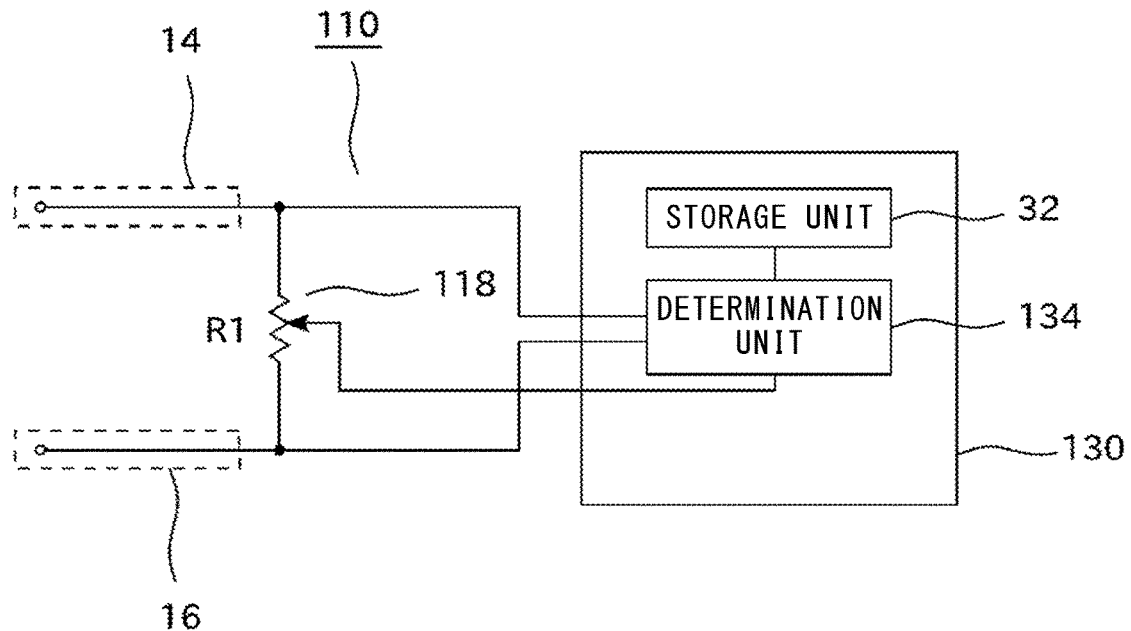
FIG. 11 is a diagram showing connection between the semiconductor measuring device and the probe card in an open-circuit state in embodiment 2.

FIG. 10 and FIG. 11 are diagrams in which the probe card 110 and a semiconductor measuring device 130 are connected to each other in a short-circuit state and an open-circuit state, respectively. The semiconductor measuring device 130 in embodiment 2 is the same as that in embodiment 1, except that the determination unit 134 can set the value of the variable resistor 118.

Since the resistor is the variable resistor 118 as described above, it is possible to easily make setting when the resistance value is to be set to a desired value. If the resistor is not a variable resistor but a resistor joined to the board of the probe card or the like by soldering or the like, it is necessary to replace the resistor itself in order to change the resistance value. However, the probe card in embodiment 2 does not require such trouble.

In addition, in the semiconductor measuring device 130, the determination unit 134 can set the value of the variable resistor 118. Therefore, even when the value (R) of resistance of the edge sensor 12 becomes greater over time, it is possible to adapt thereto. The adaptation procedure will be specifically described. First, the determination unit 134 calculates the value of R2. This value can be calculated by measuring R in a short-circuit state and then performing calculation using the expression R2=R1*R/(R1−R). Next, as described in embodiment 1, R1 is set again such that, if R2<=Rth is satisfied, the condition 1 is satisfied, and if R2>Rth is satisfied, the condition 2 is satisfied. Thus, the semiconductor measuring device 130 can correctly perform determination as to a short-circuit state and an open-circuit state. It is noted that the above operation may be performed every time the probe card 110 and the semiconductor measuring device 130 are connected to each other, or every time a semiconductor device is measured. Alternatively, the above operation may be periodically performed by setting time intervals, or the number of times for measurements may be set and the above operation may be performed every time the set number of times is reached. Alternatively, the above operation may be performed at timings other than the above timings.

It is noted that the effects obtained in embodiment 1 can be obtained also in embodiment 2.

In embodiments 1 and 2, the determination units 34 and 134 determine that the first needle 14 and the wafer 50 are in contact with each other if R<Rth is satisfied, and determine that the first needle 14 and the wafer 50 are not in contact with each other if R>=Rth is satisfied. However, for the magnitude relationships between R and Rth, the position of equality may be changed as R<=Rth and R>Rth, respectively. In this case, the positions of equalities appearing in the inequalities described above in the condition 1, the condition 2, and the like are changed. However, this merely requires some calculations as appropriate, and therefore indication or description of the calculation results is omitted here.

In the above description, the semiconductor measuring devices 30 and 130 each have the storage unit that stores the threshold value. However, the threshold value may be held in the outside, and the threshold value may be obtained through communication with the outside.

DESCRIPTION OF THE REFERENCE CHARACTERS

10, 110 probe card
12 edge sensor
14 first needle
16 second needle
18 resistor
30, 130 semiconductor measuring device
32 storage unit
34, 134 determination unit
50 wafer
118 variable resistor

The invention claimed is:

1. A probe card comprising an edge sensor having a first needle and a second needle, wherein
the first needle and the second needle are in contact with each other when the first needle and a wafer are not in contact with each other, and the first needle and the second needle are not in contact with each other when the first needle and the wafer are in contact with each other,
the probe card further comprising a variable resistor connected between the first needle and the second needle.

2. The probe card according to claim 1, wherein
the probe card is connectable to a semiconductor measuring device which determines that the first needle and the wafer are not in contact with each other if R<Rth is satisfied, and determines that the first needle and the wafer are in contact with each other if R>=Rth is satisfied, where R is a resistance value of the edge sensor and Rth is a threshold value, and
where R1 is a resistance value of the variable resistor and R2 is a resistance value of the edge sensor in a state in which the first needle and the second needle are in contact with each other and the variable resistor is removed, R1 satisfies a condition of R1>=Rth if R2<=Rth is satisfied, and R1 satisfies a condition of Rth<=R1<Rth*R2/(R2−Rth) if R2>Rth is satisfied.

3. A semiconductor measuring system comprising:
the probe card according to claim 2; and
the semiconductor measuring device being connected to the probe card.

4. A semiconductor measuring system comprising:
the probe card according to claim 2; and the semiconductor measuring device being connected to the probe card, wherein the semiconductor measuring device is configured to set the resistance value of the variable resistor.

5. A semiconductor measuring device connectable to the probe card according to claim 1, wherein the semiconductor measuring device is capable of setting a resistance value of the variable resistor.

6. The semiconductor measuring device according to claim 2, wherein the semiconductor measuring device determines that the first needle and the wafer are not in contact with each other if $R<Rth$ is satisfied, and determines that the first needle and the wafer are in contact with each other if $R>=Rth$ is satisfied, where R is a resistance value of the edge sensor and Rth is a threshold value, and where R1 is a resistance value of the variable resistor and R2 is a resistance value of the edge sensor in a state in which the first needle and the second needle are in contact with each other and the variable resistor is removed, the semiconductor measuring device is capable of setting R1 so as to satisfy a condition of $R1>=Rth$ if $R2<=Rth$ is satisfied, and is capable of setting R1 so as to satisfy a condition of $Rth<=R1<Rth*R2/(R2-Rth)$ if $R2>Rth$ is satisfied.

7. The semiconductor measuring device according to claim 5, wherein the semiconductor measuring device is capable of measuring R when the first needle and the wafer are not in contact with each other, calculating R2 from $R2=R1*R/(R1-R)$, and thus setting R1 again.

8. A semiconductor measuring system comprising:

the probe card according to claim 1; and a semiconductor measuring device connected to the probe card, wherein the semiconductor measuring device is configured to set a resistance value of the variable resistor.

9. A semiconductor measuring system comprising:

a probe card comprising an edge sensor having a first needle and a second needle, wherein the first needle and the second needle are in contact with each other when the first needle and a wafer are not in contact with each other, and the first needle and the second needle are not in contact with each other when the first needle and the wafer are in contact with each other, the probe card further comprising a variable resistor connected between the first needle and the second needle; and a semiconductor measuring device connected to the probe card and configured to determine that the first needle and the wafer are not in contact with each other if $R<Rth$ is satisfied, and determine that the first needle and the wafer are in contact with each other if $R>=Rth$ is satisfied, where R is a resistance value of the edge sensor and Rth is a threshold value.

\* \* \* \* \*